US009568961B1

(12) United States Patent
Huang et al.

(10) Patent No.: US 9,568,961 B1
(45) Date of Patent: Feb. 14, 2017

(54) ELECTRONIC APPARATUS

(71) Applicant: Celestica Technology Consultancy (Shanghai) Co. Ltd., Shanghai (CN)

(72) Inventors: Shaosong Huang, Shanghai (CN); Daowei Fan, Shanghai (CN); Wenjin Li, Shanghai (CN)

(73) Assignee: CELESTICA TECHNOLOGY CONSULTANCY (SHANGHAI) CO. LTD, Zhangjiang Hi-Tech Park, Pudong District, Shanghai (CN)

( * ) Notice: Subject to any disclaimer, the term of this patent is extended or adjusted under 35 U.S.C. 154(b) by 0 days.

(21) Appl. No.: 15/000,748

(22) Filed: Jan. 19, 2016

Related U.S. Application Data

(60) Provisional application No. 62/195,767, filed on Jul. 22, 2015.

(51) Int. Cl.
*H05K 7/20* (2006.01)
*G06F 1/18* (2006.01)
*G06F 1/20* (2006.01)

(52) U.S. Cl.
CPC ............... *G06F 1/185* (2013.01); *G06F 1/20* (2013.01); *H05K 7/20736* (2013.01)

(58) Field of Classification Search
CPC .. H05K 7/1487; H05K 7/1488; H05K 7/1489; H05K 7/20172; G06F 1/185; G06F 1/20
See application file for complete search history.

(56) References Cited

U.S. PATENT DOCUMENTS

| | | | |
|---|---|---|---|
| 8,369,092 B2* | 2/2013 | Atkins | G06F 1/187 361/727 |
| 8,427,835 B2* | 4/2013 | Xu | G06F 1/187 174/69 |
| 2010/0270897 A1* | 10/2010 | Lin | G06F 1/184 312/223.2 |
| 2011/0261526 A1* | 10/2011 | Atkins | G06F 1/187 361/679.33 |
| 2015/0120971 A1* | 4/2015 | Bae | G06F 3/0626 710/106 |
| 2015/0241945 A1* | 8/2015 | Dube | G06F 1/3234 713/320 |
| 2015/0382499 A1* | 12/2015 | Chiasson | G11B 33/124 361/679.33 |

* cited by examiner

*Primary Examiner* — Anthony Q Edwards
(74) *Attorney, Agent, or Firm* — Global IP Services; Tianhua Gu

(57) ABSTRACT

The present invention relates to an electronic apparatus, which integrates an adapter plate, a PCIE card and a fan into an input/output unit, communicates with other electronic elements in the electronic apparatus through the adapter plate in the input/output unit, and reasonably lays out elements in the input/output unit, so that more electronic elements can be laid out in a limited electronic apparatus case space, thus having a high utilization rate and a low cost. Moreover, the design of the internally integrated fan makes the input/output unit and the electronic apparatus have good heat dissipation effects, and the input/output unit may be designed as hot plug, facilitating replacement and maintenance of the whole input/output unit.

10 Claims, 10 Drawing Sheets

ELECTRONIC APPARATUS

CROSS REFERENCE TO RELATED PATENT APPLICATION

The present application claims the priority of U.S. 62/195,767 filed Jul. 22, 2015, which application is incorporated herein by reference.

BACKGROUND OF THE PRESENT INVENTION

Field of Invention

The present invention relates to the communication field, and specifically to an electronic apparatus of high density.

Description of Related Arts

With development of communication industry, structural design of communication devices, especially high-density, high-performance design of the devices also has higher requirements, the existing communication devices, in order to implement more functions, often dispose lots of electronic modules in their case, and thus laying out more modules reasonably and neatly in a limited space to increase price performance of products and bring about better experience to users will become a direction of development of the communication devices.

SUMMARY OF THE PRESENT INVENTION

In view of the shortcomings of the prior art, an object of the present invention is to provide an input/output apparatus and an electronic apparatus, used to solve the problem in the prior art that arrangement of elements inside the electronic apparatus cannot well meet high-density and high-performance characteristics.

To achieve the foregoing object and other related objects, the present invention provides an electronic apparatus, comprising an input/output unit; the input/output unit comprising: a housing comprising a bottom plate, the housing having a first end along a direction of the bottom plate and a second end opposite the first end; an adapter plate fixed onto the bottom plate, comprising an adapter plate body and an adapter plate inserting portion, the adapter plate body having a first slot and a second slot towards a direction away from the bottom plate, the adapter plate inserting portion being adjacent to the second end of the housing and exposed to the second end, and the adapter plate being electrically connected with an external electronic device through the adapter plate inserting portion; a PCIE card disposed adjacent to the first end and on the adapter plate, comprising a PCIE card body and a PCIE port, the PCIE card body being disposed on the adapter plate along the direction of the adapter plate and perpendicular to the adapter plate, the PCIE card body being inserted to the first slot of the adapter plate through a golden finger, and the PCIE port being located at the first end of the housing; and a fan module disposed adjacent to the second end and on the adapter plate, comprising a fan frame and a fan, the fan being disposed in the fan frame, and the fan module being inserted to the second slot of the adapter plate through a golden finger.

In one implementation of the present invention, the housing further comprises two sidewalls connecting the bottom plate.

In one implementation of the present invention, the housing has a first receiving space adjacent to the first end, and a case is provided with a second receiving space adjacent to the second end; the PCIE card is disposed in the first receiving space, and the fan module is disposed in the second receiving space.

In one implementation of the present invention, the fan module is fixed with the two sidewalls through screws.

In one implementation of the present invention, the number of the PCIE card is 3.

In one implementation of the present invention, the input/output apparatus further comprises an upper cover, used to partially cover the PCIE card.

In one implementation of the present invention, the number of the fan module is two, and one of the two fan modules is a fan module that provides redundant backup.

In one implementation of the present invention, the housing is provided with a snap structure adjacent to the first end, used to be in a snap connection with an external device.

In one implementation of the present invention, the electronic apparatus is a server.

In one implementation of the present invention, the size of the electronic apparatus is 2 U.

As stated above, the electronic apparatus consistent with the present invention integrates an adapter plate, a PCIE card and a fan into an input/output unit, communicates with other electronic elements in the electronic apparatus through the adapter plate in the input/output unit, and reasonably lays out elements in the input/output unit, so that more electronic elements can be laid out in a limited electronic apparatus case space, thus having a high utilization rate and a low cost. Moreover, the design of the internally integrated fan makes the input/output unit and the electronic apparatus have good heat dissipation effects, and the input/output unit may be designed as hot plug, facilitating replacement and maintenance of the whole input/output unit.

Figure 1:
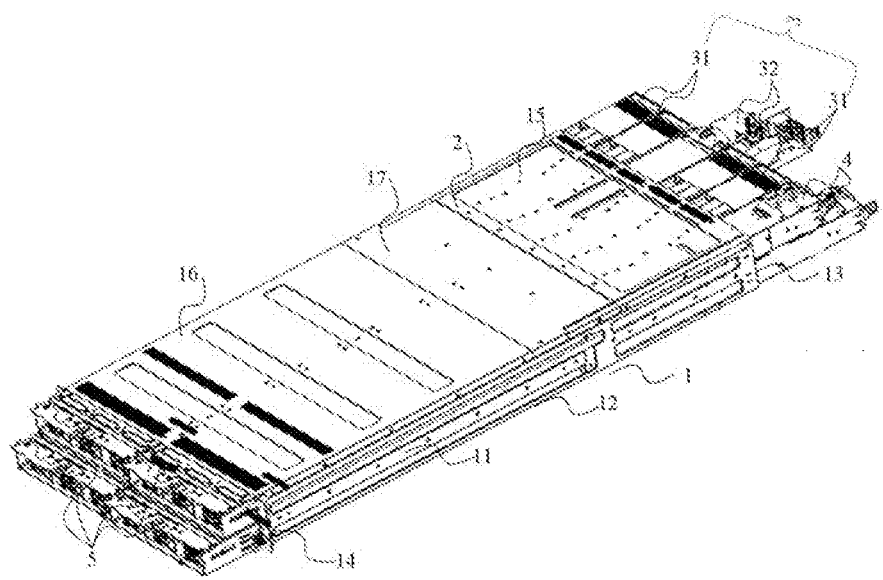
FIG. 1 is a schematic structural view of an electronic apparatus in a specific embodiment of the present invention.

DESCRIPTION ABOUT REFERENCE SIGNS 1 case
11 sidewall
12 bottom plate
13 first end
14 second end
15 first receiving space
A, B, C, D, E, F rear-end region
16 second receiving space
G, H front-end region
G1, H1 support portion
17 upper cover
2 back plate
21 first insertion and extraction portion
22 second insertion and extraction portion
23 first air vent
24 second air vent
3 I/O module
31 node I/O module
311 housing
3111 sidewall
3112 bottom plate
3113 first end
3114 second end
3115 first receiving space
3116 second receiving space
3117 top plate
312 PCIE card
3121 PCIE card body
3122 PCIE port
313 fan unit
3131 fan frame
3132 fan
32 shared I/O module
321 housing
3211 sidewall
3212 top plate
3213 bottom plate
3214 first end
3215 second end
322 main module
3221 first I/O interface
3222 second I/O interface
323 fan unit
3231 fan frame
3232 fan
4 power supply module
5 node module
51 mainboard
52 first processor
53 second processor
54 memory module
55 South Bridge chip
56 SAS adapter card
57 node back-plate
58 disk
59 support unit
591 first support portion
5911 first fixing portion
592 second support portion
5921 second fixing portion
5922 LED light pipe
593 retaining portion
594 hand-held portion

DETAILED DESCRIPTION OF THE PREFERRED EMBODIMENTS

Implementations of the present invention are described below through specific embodiments, and those skilled in the art can easily understand other advantages and effects of the present invention according to the contents disclosed in the specification.

Please refer to FIG. 1 to FIG. 20. It should be known that the structures, scales, sizes and the like drawn in the drawings of the specification are merely used to match the contents disclosed in the specification for understanding and reading of those skilled in the art, but are not used to limit limited conditions under which the present invention can be implemented, and thus do not have technical substantive meanings, and any structural modification, change in the proportional relationship or size adjustment should fall within the scope that the technical contents disclosed in the present invention can cover without affecting the effects and objects that can be achieved by the present invention. At the same time, the terms such as "up", "down", "left", "right", "middle" and "a/an" used in the specification are merely intended to facilitate clear statement, but are not used to limit the scope in which the present invention can be implemented, and change or adjustment of the relative relationship thereof should be regarded as the category in which the present invention can be implemented if the technical contents are not essentially changed.

In actual applications, the electronic apparatus consistent with the present invention, for example, is an OTT (Over The Top) high-density server, which preferably uses a 2 U case, "U" of the server is a unit that indicates an external size of the server, and is an abbreviated form of unit, and a detailed size is decided by American electronics industries association (EIA) that serves as an industry group. The reason for specifying the size of the server is to make the server keep a suitable size to be placed on an iron or aluminum rack. The rack has a screw hole that fixes the server, which is aligned with a screw hole of the server, and is fixed with a screw. The specified size is the width (48.26 cm=19 inches) and height (a multiple of 4.445 cm) of the server. As the width is 19 inches, racks that meet such a specification are also called "19-inch racks" sometimes. The thickness takes 4.445 cm as a basic unit. 1 U is 4.445 cm, and 2 U is double 1 U, that is, 8.89 cm (and so on). That is to say, the so-called "1 U server" is a product whose shape meets EIA specifications and thickness is 4.445 cm. Products designed to be capable of being placed to a 19-inch cabinet are generally called rack servers. Certainly, in actual applications, the size of the electronic apparatus consistent with the present invention is not limited thereto, and electronic apparatuses with other size specifications also apply to the technical solution of the present invention.

Figure 2:
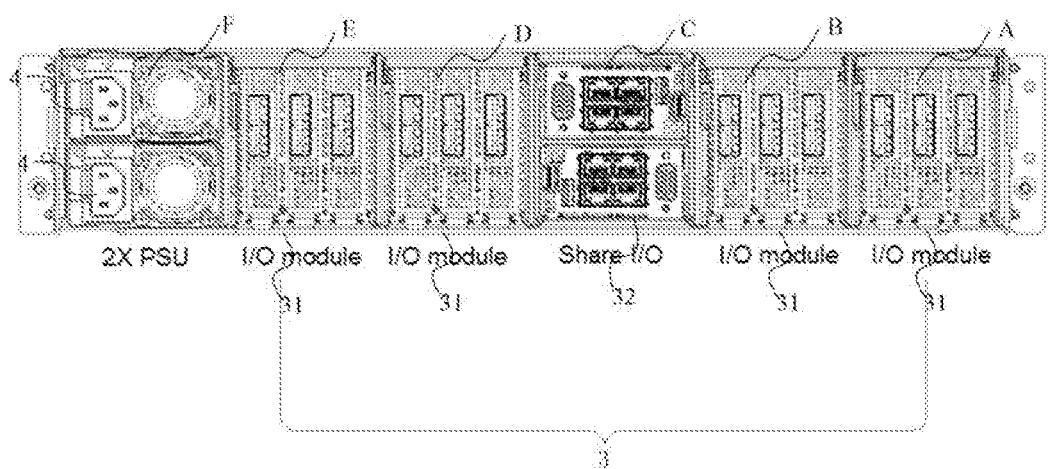
FIG. 2 is a rear view of FIG. 1.
Figure 3:
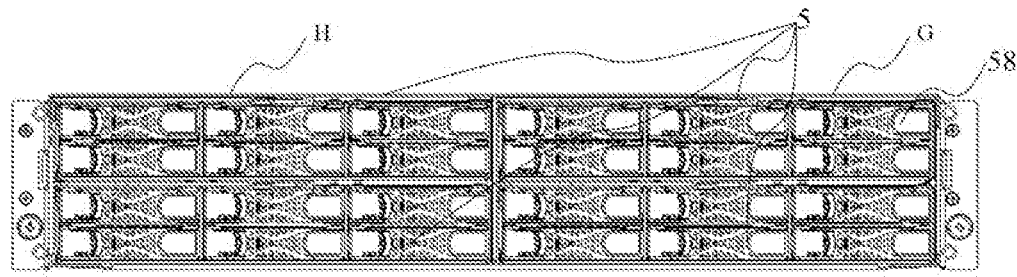
FIG. 3 is a front view of FIG. 1.

Referring to FIG. 1, FIG. 1 is a schematic structural view of an electronic apparatus in a specific embodiment of the present invention. The electronic apparatus comprises a case 1, a back plate 2, at least one I/O (input/output) module 3, at least one power supply module 4 and at least one node module 5. FIG. 2 is a rear view of the electronic apparatus shown in FIG. 1, and FIG. 3 is a front view of the electronic apparatus shown in FIG. 1.

Figure 4:
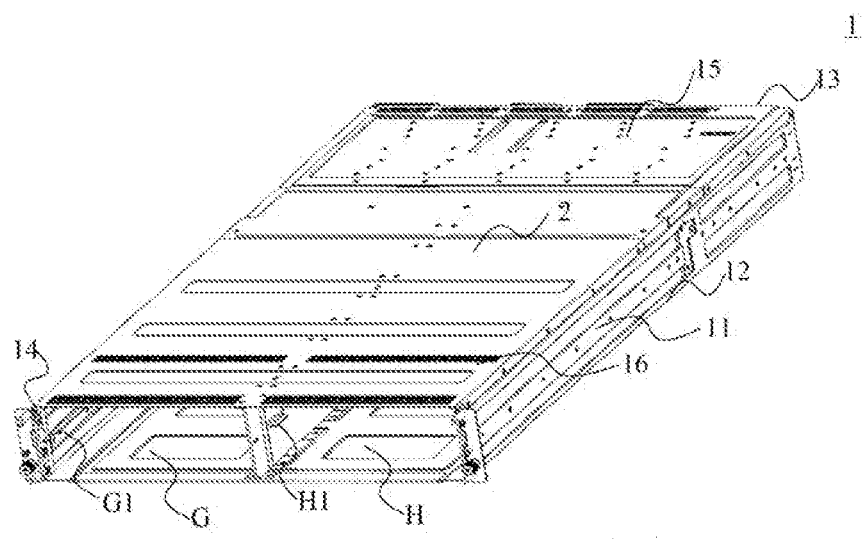
FIG. 4 is a schematic view of the whole structure of a case in a specific embodiment of the present invention.
Figure 5:
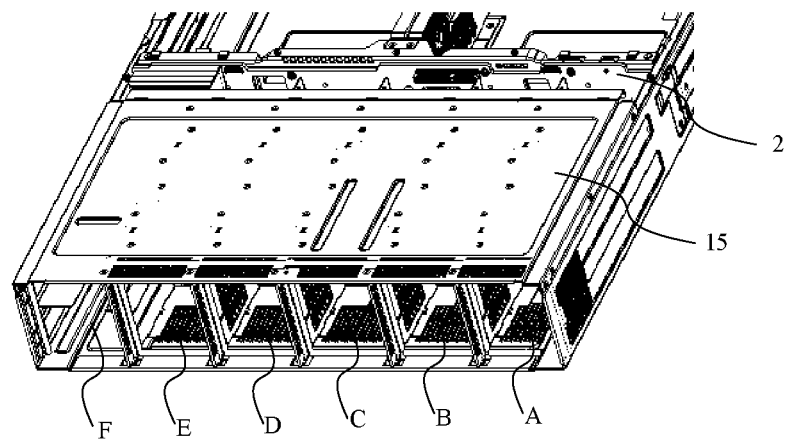
FIG. 5 is a schematic structural view of a first end portion side of the case shown in FIG. 4.

In combination with FIG. 4, which is a schematic structural view of a case of the present invention in a specific embodiment, the case 1 comprises two sidewalls 11 and a bottom plate 12 connecting the two sidewalls 11, the sidewalls 11 and the bottom plate 12 can be fixedly connected through screws or snaps or may be an integral structure, the case 1 has a first end 13 along a direction of the sidewalls 11 and a second end 14 opposite the first end, the case has a first receiving space 15 adjacent to the first end 13, and the case has a second receiving space 16 adjacent to the second end 14. The first receiving space 15 is used to receive the I/O module 3 and the power supply module 4, wherein the first receiving space 15 is divided into multiple rear-end regions having the same height and arranged side by side, and each of the rear-end regions is used to receive at least one I/O module 3 or at least one power supply module 4. In this embodiment, for example, in combination with FIG. 5, the rear-end region is divided into 6 regions, which are respectively a rear-end region A, a rear-end region B, a rear-end region C, a rear-end region D, a rear-end region E and a rear-end region F. The second receiving space 16 is used to receive the node module 5, wherein the second receiving space 16 is further divided into multiple front-end regions, and each of the front-end regions is provided with at least one node module 5. Moreover, in combination with FIG. 4, the second receiving space 16 is divided into two front-end regions G and a front-end region H, the front-end regions G and the front-end region H can accommodate two node modules 5 stacked respectively.

Moreover, in actual applications, the case 1 of a finished electronic apparatus further comprises an upper cover 17, the upper cover 17 is an integral structure, disposed, opposite the bottom plate 12, to the top of the electronic apparatus, or as in this embodiment, the upper cover 17 comprises two parts, that is, a front upper cover that covers the second receiving space 16 and the back plate 2 and a rear upper cover that covers the first receiving space 15, and the two parts cover can be fixedly connected through corresponding screw holes.

Figure 6:
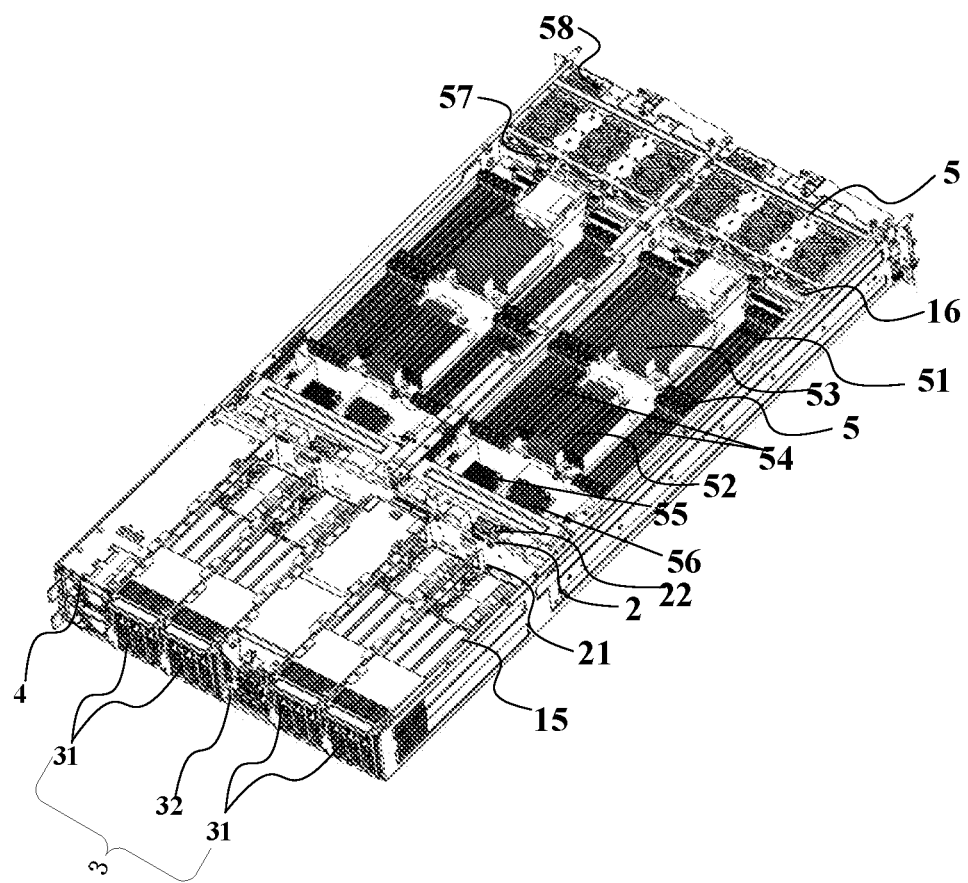
FIG. 6 is a schematic structural view of an electronic apparatus in a specific embodiment of the present invention.

The back plate 2 is disposed, perpendicular to the two sidewalls 11, between the first receiving space 15 and the second receiving space 16, and in combination with FIG. 6 (FIG. 6 is a schematic structural view of the electronic apparatus of FIG. 1 whose upper cover has been removed), has a first insertion and extraction portion 21 towards the first receiving space 15 and a second insertion and extraction portion 22 towards the second receiving space 16, preferably, the first insertion and extraction portion 21 and the second insertion and extraction portion 22 are, for example, high-speed back plate connectors, or for example, may be slots, used to match a golden finger and make electrical connections, and such design can avoid use of a tool and can also make the interior of the case 1 much cleaner and neater. The back plate 2 can make individual electrical modules (the I/O module 3, the power supply module 4 and the node module 5) disposed in the first receiving space 15 and the second receiving space 16 connected with each other, equivalent to a bridge, so that the electrical modules can cooperate with each other, to implement particular electrical functions.

The I/O module 3 has an I/O module assembling portion, and is pluggably electrically connected to the first insertion and extraction portion 21 of the back plate 2, and the I/O module assembling portion is preferably a golden finger structure or a back plate connector electrically connected with the first insertion and extraction portion 21 of the back plate of the slot structure.

The power supply module 4 has a power supply module assembling portion, and is pluggably electrically connected to the first insertion and extraction portion 21 of the back plate 2, used to supply power of the electronic apparatus. In this embodiment, preferably, the number of the power supply module 4 is two, one of the two power supply modules 4 is a power supply module 4 that provides redundant backup, and the two power supply modules 4 are stacked into one of the rear-end regions. Preferably, the power supply modules 4 supply power for other electrical components in the electrical apparatus through the back plate, and more preferably, the power supply modules 4 communicate with the other electrical components in the electrical apparatus through a I2C bus.

The power supply module assembling portion is preferably a golden finger structure and electrically connected with the first insertion and extraction portion of the back plate of the slot structure.

In a specific embodiment of the present invention, the I/O module 3 preferably comprises a node I/O module 31 and a shared I/O module 32.

Figure 7:
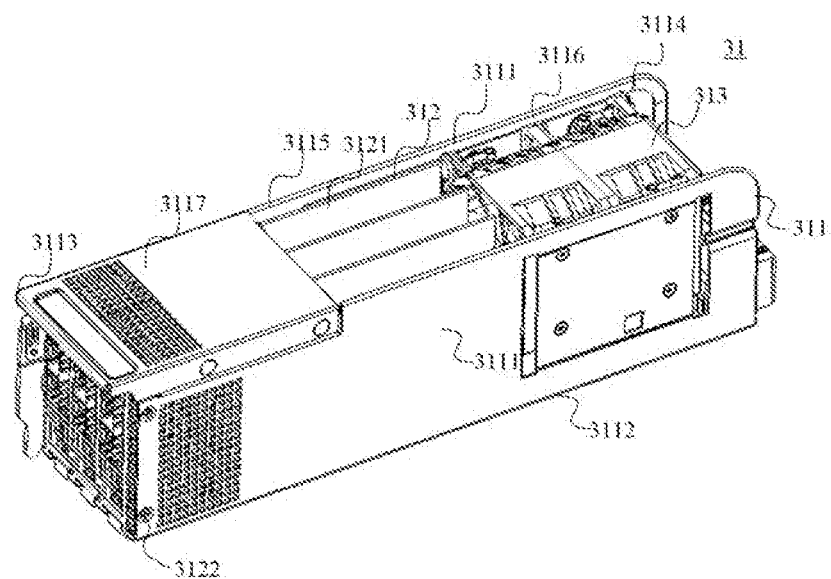
FIG. 7 is a schematic structural view of a node I/O module in a specific embodiment of the present invention.
Figure 8:
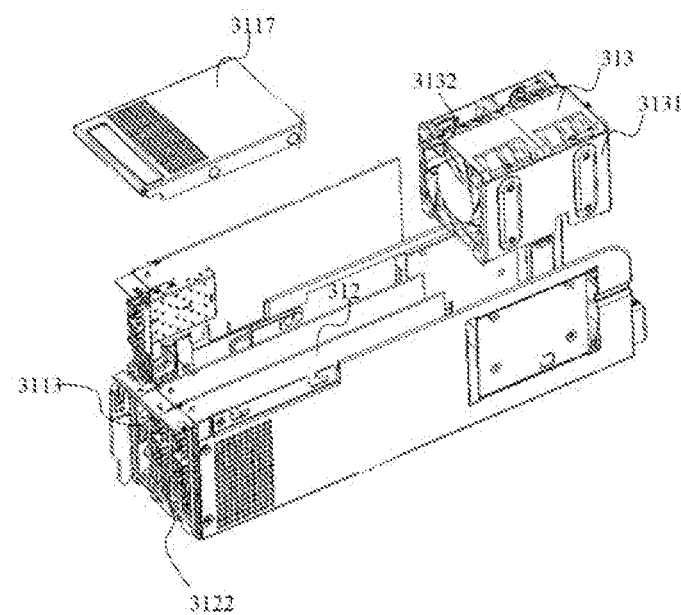
FIG. 8 is a schematic disassembled view of the node I/O module shown in FIG. 7.
Figure 9:
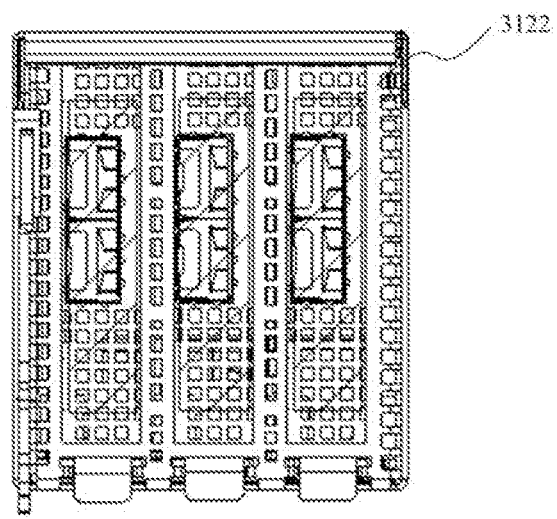
FIG. 9 is a front view of the node I/O module shown in FIG. 7.
Figure 10:
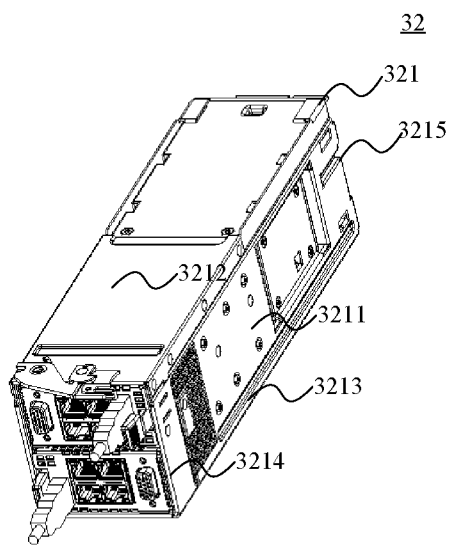
FIG. 10 is a schematic structural view of a shared I/O module in a specific embodiment of the present invention.
Figure 11:
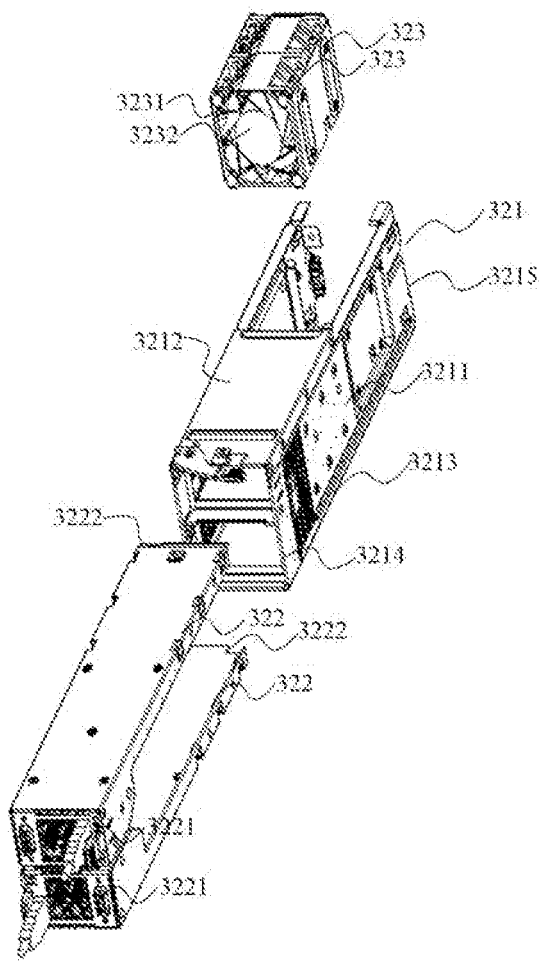
FIG. 11 is a disassembled view of the shared I/O module shown in FIG. 10.

Wherein, each node I/O module 31 is electrically connected with the node module 5 through the back plate 2, and specific reference can be made to FIG. 7, FIG. 8 and FIG. 9 for the structure of the node I/O module 31, and the node I/O module 31 comprises:

a housing 311 comprising two sidewalls 3111 and a bottom plate 3112 connecting the two sidewalls 3111, the housing 311 having a first end 3113 along a direction of the two sidewalls 3111 and a second end 3114 opposite the first end 3113, the housing 311 having a first receiving space 3115 adjacent to the first end 3113, and the housing 311 having a second receiving space 3116 adjacent to the second end 3114; in this embodiment, the housing 311 further comprises a top plate 3117 that covers part of the first receiving space 3115, the top plate 3117 mainly plays a role of protecting electronic elements received in the first receiving space 3115, and in other specific embodiments, the size of the top plate 3117 may be shorter or longer, or the top plate 3117 may be omitted.

an adapter plate (not shown) disposed in the housing 311, fixed, parallel to the bottom plate 3112, onto the bottom plate 3112, and comprising an adapter plate body and an adapter plate inserting portion, the adapter plate body having a first slot and a second slot towards a direction away from the bottom plate 3112, the adapter plate inserting portion being adjacent to the second end 3114 of the housing 311 and exposed to the second end 3114, and the adapter plate being electrically connected with the first insertion and extraction portion 21 of the back plate 2 through the adapter plate inserting portion.

a PCIE card 312 disposed in the first receiving space 3115, comprising a PCIE card body 3121 and a PCIE port 3122, the PCIE port is a PCIE 10 port in specific application, the PCIE card body 3121 being disposed parallel to the sidewalls 3111 and perpendicular to the bottom plate 3112, the PCIE card body 3121 being inserted to the first slot of the adapter plate through a golden finger, and the PCIE port 3122 being located at the first end 3113 of the housing 311; in this embodiment, the number of the PCIE card 312 is preferably 3.

a fan unit 313 disposed in the second receiving space 3116; in this embodiment, the number of the fan unit is two, and one of the two fan units 313 is a fan unit 313 that provides redundant backup. The fan unit 313 comprises a fan frame 3131 and a fan 3132, the fan 3132 is disposed in the fan frame 3131, and the fan unit 313 is inserted to the second slot of the adapter plate through a connector, wherein the connector is preferably a golden finger or a wirecable. The fan 3132 is a hot plug structure. Moreover, with modular design of the node I/O module 31, when it is necessary to replace the fan unit 313 or repair the fan unit 313, it is feasible to directly take out the node I/O module 31 from the receiving space without removing the housing of the server case (most fans in the existing server case need to open the top cover in the case of maintenance or replacement), so operations are convenient and maintenance efficiency is increased. The fan unit 313 can be fixed to the housing 311 through screws.

In another specific embodiment, the node I/O module may be a drawer-type structure, the two sidewalls may be omitted, and the fan unit 313 is directly fixed onto the adapter plate.

The shared I/O module 32 is selectively electrically connected with one node module 5 through the back plate 2; preferably, the electronic apparatus further comprises a switch module, used to, according to a switch signal, cause the shared I/O module 32 to communicate with one of the node modules 5. For example, the switch module is a toggle button (for example, a toggle button controlled by a mouse or a keyboard), the node module 5 that communicates with the shared I/O module 32 is switched by pressing the button, or the node module 5 that communicates with the shared I/O module 32 is switched according to a remote network control signal. Specific reference can be made to FIG. 10 and FIG. 11 for the structure of the shared I/O module 32, which comprises:

a housing 321 comprising two sidewalls 3211, and a top plate 3212 and a bottom plate 3213 connecting the two sidewalls 3211, the housing 321 having a first end 3214 along a direction of the two sidewalls 3211 and a second end 3215 opposite the first end 3214;

two main modules (two shared I/O units) 322 respectively disposed on inner side surfaces of the top plate 3212 and the bottom plate 3213 of the housing 321 and form a receiving space with the two sidewalls 3211 of the housing 321, that is, the thickness of one end of the main modules 322 is less than that of the other end, and such design can form the receiving space on the side with less thickness, used to receive fans and other units, which can maximize use of the space. Each main module 322 comprises a first I/O interface 3221 connected with an external device and a second I/O interface 3222 electrically connected with one of the at least two node modules 5; the first I/O interface 3221, for example, comprises one or more combinations of a USB port interface, a VGA port interface and a network port interface, and the two main modules 322 are mutual redundancy design.

a fan unit 323 received in the receiving space, comprising a fan frame 3231 and a fan 3232, the fan 3232 being disposed in the fan frame 3231. The fan 3232 is a hot plug structure. Moreover, with modular design of the shared I/O module 32, when it is necessary to replace the fan unit 323 or repair the fan unit 323, it is feasible to directly take out the shared I/O module 32 from the receiving space without removing the housing of the server case (most fans in the existing server case need to open the top cover in the case of maintenance or replacement), so operations are convenient and maintenance efficiency is increased, which, while ensuring that the temperature of the case reaches the standard, makes the fan unit assembled and disassembled conveniently and easy to maintain.

Figure 12:
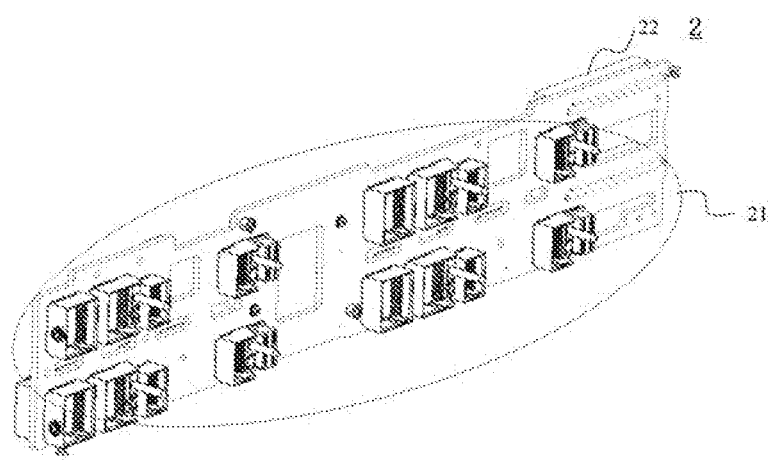
FIG. 12 is a schematic structural view of a back plate in a specific embodiment of the present invention.
Figure 13:
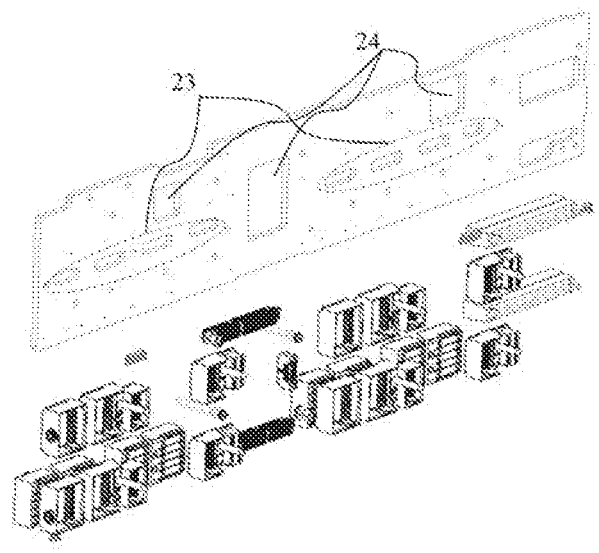
FIG. 13 is a disassembled view of the back plate shown in FIG. 12.

Moreover, heat dissipation of the server case has relative great influence on ensuring efficient operation thereof, herein, in combination with schematic structural views of the back plate 2, i.e., FIG. 12 and FIG. 13, the back plate 2 is provided with an air vent, and the air vents correspond to the fan unit 313 of the node I/O module 31, the fan unit 323 of the shared I/O module 32 and elements to be cooled, to cause the air vents to cooperate with the fan units 313 and 323 and the elements to be cooled, to form an air flow channel. The back plate 2 is transversely opened with multiple evenly-distributed first air vents 23 corresponding to the fan unit 313 of the node I/O module 31 and second air vents 24 corresponding to the fan unit 323 of the shared I/O module 32, the arrangement of the first air vents 23 and the second air vents 24 can make air flows of the fan unit 313 and the fan unit 323 more flow towards units to be cooled (for example, processors and DDRs) on the node module 5, and sockets on the back plate 2 are reasonably disposed on two sides of the first air vents 23 and the second air vents 24, that is, cooling demands of the server case can be met in the event that reasonable arrangement of the sockets on the back plate 2 is ensured. Preferably, in the figure, the first air vent 23 is of evenly-distributed strip-type holes, and the second air vent 24 is of rectangle holes.

In one implementation of the present invention, heights of the node I/O module 31, the shared I/O module 32 and the power supply module 4 are preferably the same as that of the rear-end regions, and their lengths correspond to that of the rear-end regions, so that more modules can be laid out in a limited case space; specifically, the node I/O module 31, the shared I/O module 32 and the power supply module 4 are respectively received in one corresponding rear-end region, and there are an even number of node I/O modules 31, which are bilaterally symmetrically disposed in the corresponding rear-end regions relative to the shared I/O module 32. In order to accommodate all the node I/O modules 31, the shared I/O module 32 and the power supply module 4, the number of the rear-end regions is preferably an even number greater than or equal to 4.

Specifically, for example, the number of the node I/O module 31 is four, the number of the shared I/O module 32 is one, and the node I/O modules 31, the shared I/O module 32 and the power supply module 4 are disposed in the rear-end regions from left to right or from right to left in a sequence as follows: the power supply module 4, two node I/O modules 31, the shared I/O module 32, two node I/O modules 31. That is, in combination with FIG. 1, FIG. 2 and FIG. 3, the power supply module 4 is disposed in the rear-end region F, the power supply module 4 comprises two power supply units which are mutually redundant and stacked in the rear-end region F, the shared I/O module 32 is disposed in the rear-end region C, and the node I/O modules 31 are respectively disposed in the rear-end regions A, B, D and E, and comprise four node modules 5 each two of which are stacked in the second receiving space 16.

The shared I/O module 32 is placed in the middle, to make distances from signals of the node modules 5 in the second receiving space 16 of the electronic apparatus to the shared I/O module 32 basically the same and ensure symmetry of performance of signal transmission, and the four node I/O modules 31 are disposed on two sides of the shared I/O module 32, to make distances from the signals of the node modules 5 in the second receiving space 16 of the electronic apparatus to the corresponding node I/O modules 31 equal and ensure symmetry of performance of signal transmission.

Moreover, in this embodiment, more preferably, lengths of the power supply module 4, the shared I/O module 32 and the node I/O modules 31 are basically the same, in terms of height, the height of the power supply module 4 and the shared I/O module 32 is basically half of the receiving height of the first receiving space 15, and the height of the node I/O modules 31 is basically the same as the receiving height of the first receiving space 15, to maximize space utilization in the first receiving space 15 of the case of the electronic apparatus, and such length and height setting shares a front-end module partition to the maximum possible extent, thus achieving the effect of cost reduction.

Please refer to FIG. 2, the port interface of the I/O module 3 and the port interface of the power supply module 4 are at the first end 13. That is, the port interface of the I/O module 3, as shown in FIG. 7, the PCIE port of the PCIE card, is at the first end 13, and the port interface of the shared I/O module 32 comprises a USB port, a VGA port and a network port, which are also at the first end 13, and in another specific embodiment, the port of the shared I/O module 32 may also be of other port type. More preferably, designing the shared I/O module 32 matching different port types can make replacement according to application requirements.

Herein, refer to FIG. 6, the node module 5 has a node module assembling portion, is pluggably electrically connected to the second insertion and extraction portion 22 of the back plate 2, and communicates with the corresponding I/O module (the node I/O module 31 or the shared I/O module 32) through the back plate 2.

The node module 5 comprises a mainboard 51 as shown in the FIG. 6, the mainboard 51 comprises a first electrical connection portion (not shown) and a second electrical connection portion (not shown), and the first electrical connection portion can be electrically connected with electrical modules (a node I/O module 31, a shared I/O module 32 and a power supply module 4) in the first receiving space 15 through the back plate 2. The second electrical connection portion is electrically connected with a plurality of expansion disks through an anode back-plate 57 of the node module 5. The node module 5 further comprises two processors (CPUs) disposed at the mainboard along the node length direction, which are respectively a first processor 52 and a second processor 53, the first processor 52 and the second processor 53 are electrically connected and disposed on the mainboard 51, to form a dual-processor, and the model of the first processor 52 and the second processor 53 is, for example, Skylake; the processors have great heat productivity during operation, therefore, heat sinks are disposed on the top of the first processor 52 and the second processor 53, the first processor 52 is provided with a memory module 54 electrically connected with the first processor 52 respectively along two sides of the width direction of the node module 5, which are disposed on the mainboard, in this embodiment, each memory module 54 is selected to comprise 6 DDRs (Double Data Rate, double data rate synchronous dynamic random memory), so, the first processor is electrically connected with 12 DDRs. In another embodiment, a heat sink is correspondingly disposed above each memory module 54 as desired; the second processor 53 is provided with a memory module 54 electrically connected with the second processor 23 along two sides of the width direction of the node module 5, which are disposed on the mainboard 51, in this embodiment, each memory module 54 is selected to comprise 6 DDRs (Double Data Rate, double data rate synchronous dynamic random memory), so, the second processor 53 is electrically connected with 12 DDRs and a heat sink is correspondingly disposed above each memory module 54. The node module 5 is provided with a South Bridge chip 55 and a BMC (not shown) (Baseboard Management Controller) near the first electrical connection portion on the mainboard 51, and in this embodiment, the first processor 52 directly communicates with the PCIE card of the corresponding node I/O module 31, and the number of the PCIE card of the corresponding node I/O module 31 is preferably 3. The first processor 52 is electrically connected with the shared I/O module 32 through the South Bridge chip 55 and the BMC. The node module 5 is also provided with a disk module and according to the specific configuration condition of the disk module, the second processor 53 is directly electrically connected with the disk module, or is electrically connected with the disk module through a SAS adapter card 56 as shown in FIG. 6. In the present embodiment, the type of the SAS adapter card 56 is SAS3008 produced by LSI company. In actual application, the disk module consists of a plurality of disks 58 as shown in FIG. 6, and in the present embodiment, the disk module comprises six disks 58. Preferably, the case 1 is provided with a slide track at the inner side of the second side wall 11 of the second receiving space 16, the node module 5 and the disk module are provided with a slideway corresponding to the slide track, for facilitating the arrangement or extraction of the node module 5 in the second receiving space 16.

Figure 14:
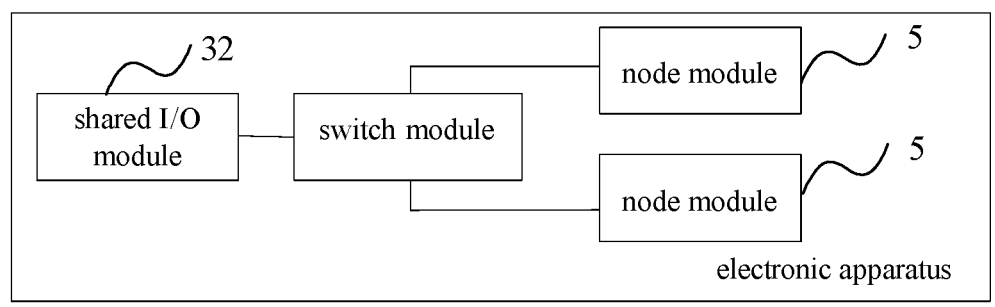
FIG. 14 is a schematic modular view of circuit connection between a shared I/O module and a node module in an embodiment of the present invention.
Figure 15:
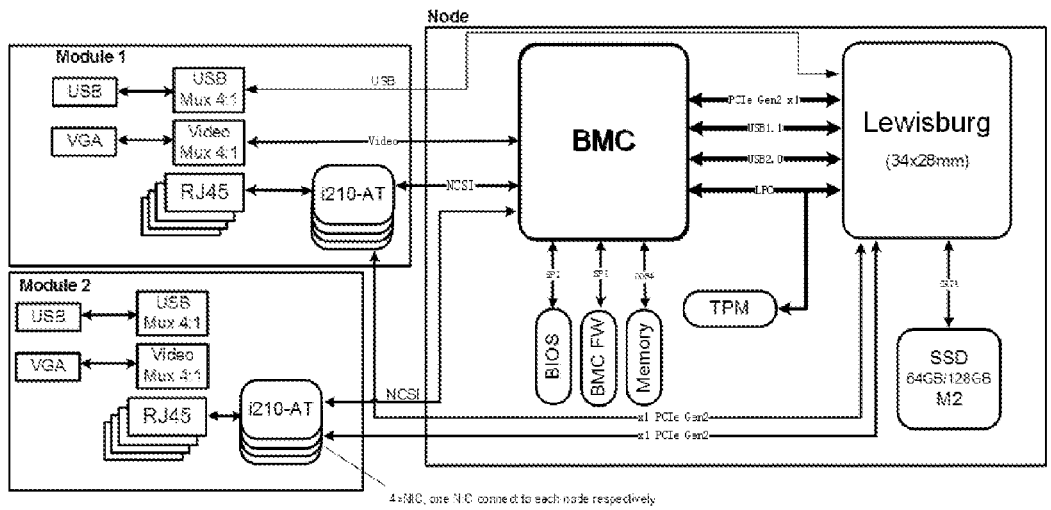
FIG. 15 is a schematic view of a principle of circuit connection between a shared I/O module and a node module in an embodiment of the present invention.

In the present invention, an electrical connection relationship between the shared I/O module 32 and the node module 5 is as shown in FIG. 14, and the shared I/O module 32 is electrically connected with at least two node modules 5 through a switch module to receive the switch signal when receiving the switch signal, and to cause the shared I/O module 32 to communicate with one node module 5 of the at least two node modules 5. Specifically:

In one specific embodiment, referring to FIG. 15, FIG. 15 is a schematic view of a principle of circuit connection between a shared I/O module and a node module in an embodiment of the present invention. The two main modules 322 respectively comprise a network card port, a USB port and a video port. The first I/O interface 3221 comprises a network card port interface, a USB port interface and a video port interface. The USB port and the video port are electrically connected with the node modules 5 through the switch module, used to cause the USB port and the video port to be electrically connected with one node module 5 according to a selection signal when receiving the selection signal. The node module 5 comprises a South Bridge chip and a BMC electrically connected with the South Bridge chip, each of the network card ports is electrically connected with the South Bridge chip 55 and the BMC of the corresponding node module 5 respectively, the USB port is electrically connected with the South Bridge chip through the switch module, and the video port interface is electrically connected with the BMC through the switch module. The model of the South Bridge chip is, for example, Intel Lewisburg.

Figure 16:
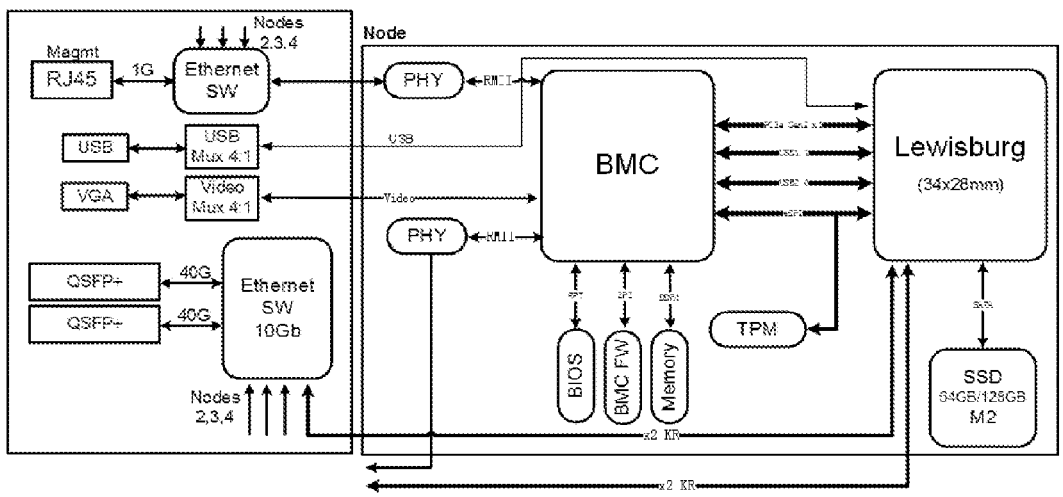
FIG. 16 is a schematic view of a principle of circuit connection between a shared I/O module and a node module in an embodiment of the present invention.

In another specific embodiment, referring to FIG. 16, FIG. 16 is a schematic view of a principle of circuit connection between a shared I/O module and a node module in an embodiment of the present invention. The two main modules 322 respectively comprise a network card port, a USB port, a video port, 1G Ethernet switch, 10G Ethernet switch and a small pluggable optical module. The optical module is preferably a quad small form-factor pluggable (QSFP) optical module; the network card port is electrically connected with the 1G Ethernet switch, and the small form-factor pluggable optical module is electrically connected with the 10G Ethernet switch; and the first I/O interface 3221 comprises a network card port interface, a USB port interface, a video port interface and an optical module port interface. The node module 5 comprises a South Bridge chip 55, a BMC electrically connected with the South Bridge chip 55 and a physical layer chip electrically connected with the BMC. The USB port is electrically connected with the South Bridge chip 55 through the switch module, the video port interface is electrically connected with the BMC through the switch module, and the number of the physical layer chip corresponds to that of the shared I/O unit; the 1G Ethernet switch of each shared I/O unit is electrically connected with the corresponding physical layer chip, and the 10G Ethernet switches of the shared I/O units are all electrically connected with the South Bridge chip. The model of the South Bridge chip 55 is, for example, Intel Lewisburg.

Figure 17:
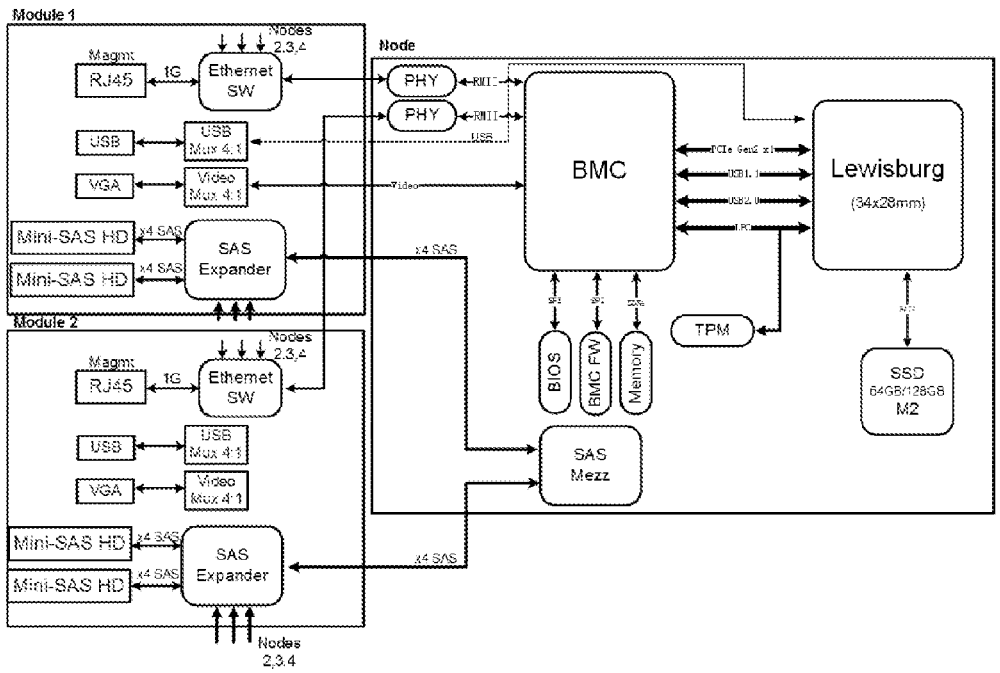
FIG. 17 is a schematic view of a principle of circuit connection between a shared I/O module and a node module in an embodiment of the present invention.

In another specific embodiment, referring to FIG. 17, FIG. 17 is a schematic view of a principle of circuit connection between a shared I/O module and a node module in an embodiment of the present invention. The two main modules 322 respectively comprise a network card port, a USB port, a video port, 1G Ethernet switch, a disk port and a disk expander. In specific application, the disk port is a disk expansion port. The disk port is preferably a MiniSAS port, the network card port is electrically connected with the 1G Ethernet switch, the disk port is electrically connected with the disk expander, and the first I/O interface further comprises a disk port interface. The first I/O interface 3221 comprises a network card port interface, a USB port interface, a video port interface and a disk port interface. The node module 5 comprises a South Bridge chip 55, a BMC electrically connected with the South Bridge chip 55, a physical layer chip and a disk expansion card; the USB port is electrically connected with the South Bridge chip 55 through the switch module, and the video port interface is electrically connected with the BMC through the switch module, and the number of the physical layer chip corresponds to that of the shared I/O unit; the 1G Ethernet switch of each shared I/O unit is electrically connected with the corresponding physical layer chip, and the disk expanders of the shared I/O units are all electrically connected with the SAS adapter card 56. The model of the South Bridge chip 55 is, for example, Intel Lewisburg.

Referring to FIG. 6 again, the node module 5 comprises the node back-plate 57, and a disk 58 electrically connected with the second processor 53 through the node back-plate 57; in this embodiment, each node module 5 comprises six disks 58, which are stacked up and down (i.e., a manner of 3*2) in a cavity of the node module 5.

In one implementation of the present invention, in combination with FIG. 4, the second receiving space 16 is divided into two front-end regions bilaterally symmetrical and having the same shape, that is, a front-end region G and a front-end region H. The height of the node module 5 is half of that of the second receiving space 16, the number of the node module 5 is four, and in the front-end region G and the front-end region H, two node modules 5 are respectively stacked up and down.

In specific applications, preferably, the two front-end regions G and H bilaterally symmetrical are two cavities having the same shape, an inner side of each cavity is provided with two opposite support portions G1 and H1 along the direction of the sidewalls, wherein the support portions G1 and H1 are in positions of half of the height of the second receiving space 16, in each of the front-end cavities G and H, two node modules 5 are respectively stacked up and down, wherein one is placed on the bottom plate 11, and the other end is placed on the support portion G1 or H1. More preferably, in another specific embodiment, corresponding positions of the bottom plate 11 and the support portion G1 or H1 can be provided with a sliding-rail structure, the node modules 5 are preferably provided with pulley structures, which can make the node modules 5 slide into the front-end region G or H or extracted from the front-end region G or H. Or, preferably, the case 1 is provided with a slide track at the inner side of the second side wall 11 of the second receiving space 16, the node module 5 and the disk module are provided with a slideway corresponding to the slide track.

Figure 18:
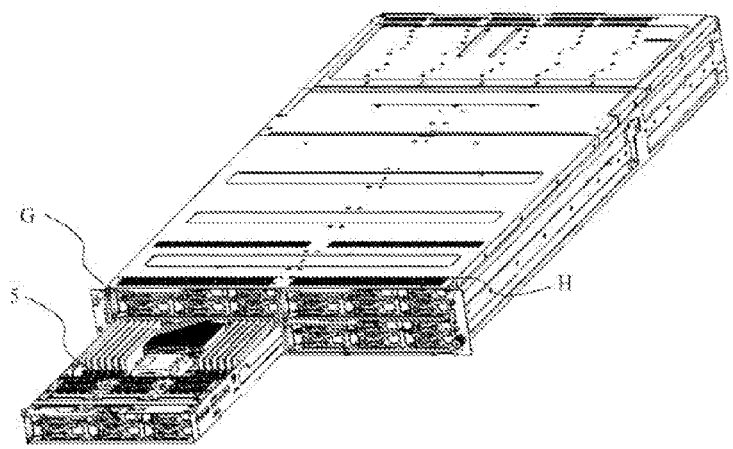
FIG. 18 is a schematic structural view of an electronic apparatus in a specific embodiment of the present invention.
Figure 19:
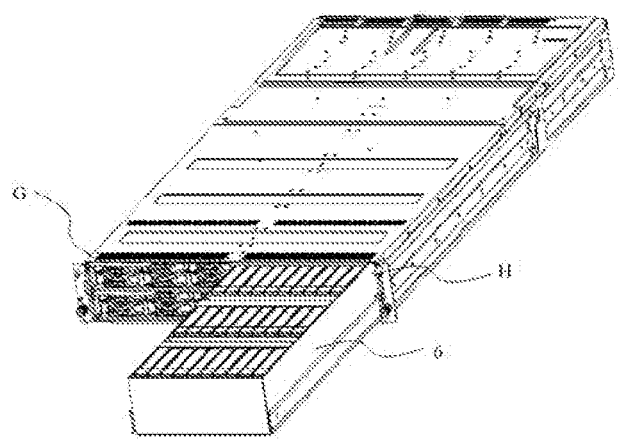
FIG. 19 is a schematic structural view of an electronic apparatus in a specific embodiment of the present invention.

In another specific embodiment, for example, referring to FIG. 18 and FIG. 19, the node modules 5 stacked up and down in the electronic apparatus are replaced with a memory module 6, to implement the function of storing the server.

Figure 20:
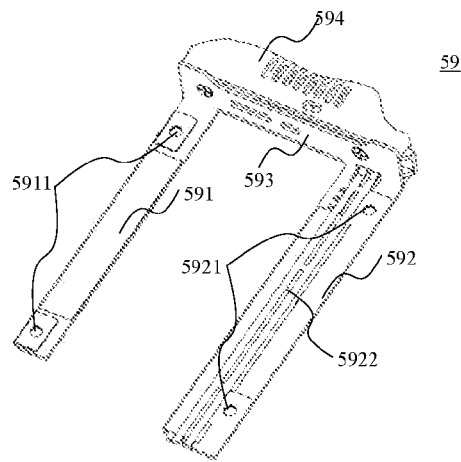
FIG. 20 is a schematic structural view of a disk support portion in a specific embodiment of the present invention.
Figure 21:
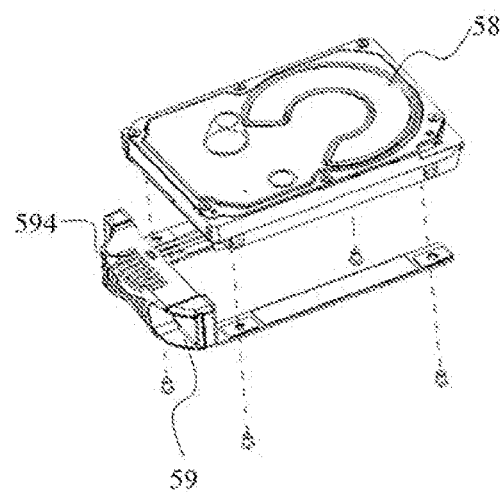
FIG. 21 is a schematic structural view showing that the disk support portion shown in FIG. 20 is used to assemble a disk.

Moreover, preferably, the support unit 59 corresponding to each disk 58 is preferably as shown in FIG. 20 and FIG. 21, comprising:

a first support portion 591, which is a plane structure and has a first fixing portion 5911;

a second support portion 592, which is a plane structure, is in the same plane with the first support portion 591 and has a second fixing portion 5921; the second support portion 592, preferably, is further provided with an LED light pipe 5922 in this embodiment, so that the installation position of the disk 58 can be found easily in a darker state; of course, in other embodiments, the LED light pipe 5922 also may be disposed in the first support portion 591; and preferably, in this embodiment, around the first fixing portion 5911 and the second fixing portion 5912 is provided vibration-absorptive material, so as to reduce the vibration frequency of the disk during the movement of the electronic apparatus, to protect the safety of the disk;

a retaining portion 593, which connects the first support portion 591 and the second support portion 592, to form a U-shaped space, and the retaining portion 593 is perpendicular to the first support portion 591 and the second support portion 592; preferably, the retaining portion 593, the first support portion 591 and the second support portion 592 are an integral structure.

The disk 58 can be placed at the first support portion 591 and the second support portion 592, and be fixed to the first fixing portion 5911 and the second fixing portion 5921 by way of screw fixation or weld, etc.

The support unit 59 abandons the traditional half-surround manner, and reduces transverse space after installation of the disk 58 in the second receiving space 16, that is, plenty of disks can be installed in a limited space. More preferably, multiple heat-dissipating holes can be disposed on the first support portion 591 and the second support portion 592, to devote greater efforts to heat dissipation while support of the disk 58 is met.

In the present embodiment, as shown in FIGS. 20 and 21, the retaining portion 593 is further provided with a hand-held portion 594 outside, the hand-held portion 594 is provided with a lock unit, which is locked into a place or re-locked from the place by its inner spring-like structure, so that the support portion 59 may be flexibly fixed to or extracted from a corresponding position in the second receiving space 16.

To sum up, the electronic apparatus consistent with the present invention integrates an adapter plate, a PCIE card and a fan into an input/output unit, communicates with other electronic elements in the electronic apparatus through the adapter plate in the input/output unit, and reasonably lays out elements in the input/output unit, so that more electronic elements can be laid out in a limited electronic apparatus case space, thus having a high utilization rate and a low cost. Moreover, the design of the internally integrated fan makes the input/output unit and the electronic apparatus have good heat dissipation effects, and the input/output unit may be designed as hot plug, facilitating replacement and maintenance of the whole input/output unit. Therefore, the present invention effectively overcomes various shortcomings in the prior art and has a high industrial utilization value.

The embodiments merely exemplarily describe the principle and effects of the present invention, but are not to limit the present invention. Any person skilled in the art can make modifications and variations to the embodiments without departing from the spirit and category of the present invention. Therefore, all modifications or variations completed by those with ordinary skill in the art without departing from the spirit and technical thoughts disclosed by the present invention should be covered by the claims of the present invention

What is claimed is:

1. An electronic apparatus, comprising an input/output unit;

the input/output unit comprising:

a housing comprising a bottom plate, the housing having a first end along a direction of the bottom plate and a second end opposite the first end;

an adapter plate fixed onto the bottom plate, comprising an adapter plate body and an adapter plate inserting portion, the adapter plate body having a first slot and a second slot towards a direction away from the bottom plate, the adapter plate inserting portion being adjacent to the second end of the housing and exposed to the second end, and the adapter plate being electrically connected with an external electronic device through the adapter plate inserting portion;

a PCIE card disposed adjacent to the first end and on the adapter plate, comprising a PCIE card body and a PCIE port, the PCIE card body being disposed on the adapter plate along the direction of the adapter plate and perpendicular to the adapter plate, the PCIE card body being inserted to the first slot of the adapter plate through a golden finger, and the PCIE port being located at the first end of the housing; and a fan module disposed adjacent to the second end and on the adapter plate, comprising a fan frame and a fan, the fan being disposed in the fan frame, and the fan module being inserted to the second slot of the adapter plate through a golden finger.

2. The electronic apparatus as in claim 1, wherein the housing further comprises two sidewalls connecting the bottom plate.

3. The electronic apparatus as in claim 2, wherein the housing has a first receiving space adjacent to the first end, and the case is provided with a second receiving space adjacent to the second end; the PCIE card is disposed in the first receiving space, and the fan module is disposed in the second receiving space.

4. The electronic apparatus as in claim 3, wherein the fan module is fixed with the two sidewalls through screws.

5. The electronic apparatus as in claim 1, wherein the number of the PCIE card is three.

6. The electronic apparatus as in claim 2, wherein the input/output apparatus further comprises an upper cover, used to partially cover the PCIE card.

7. The electronic apparatus as in claim 1, wherein the number of the fan module is two, and one of the two fan modules is a fan module that provides redundant backup.

8. The electronic apparatus as in claim 1, wherein the housing is provided with a snap structure adjacent to the first end, used to be in a snap connection with an external device.

9. The electronic apparatus as in claim 1, wherein the electronic apparatus is a server.

10. The electronic apparatus as in claim 9, wherein the size of the electronic apparatus is 2 U.

* * * * *